United States Patent
Ryvkin et al.

(10) Patent No.: US 11,777,278 B2
(45) Date of Patent: Oct. 3, 2023

(54) METHOD OF MANUFACTURING OPTICAL SEMICONDUCTOR APPARATUS AND THE APPARATUS

(71) Applicant: OULUN YLIOPISTO, Oulu (FI)

(72) Inventors: Boris Ryvkin, St. Petersburg (RU); Eugene A. Avrutin, York (GB); Juha Kostamovaara, Oulu (FI)

(73) Assignee: OULUN YLIOPISTO, Oulu (FI)

( * ) Notice: Subject to any disclaimer, the term of this patent is extended or adjusted under 35 U.S.C. 154(b) by 98 days.

(21) Appl. No.: 16/627,422

(22) PCT Filed: Jun. 28, 2018

(86) PCT No.: PCT/FI2018/050517
§ 371 (c)(1),
(2) Date: Dec. 30, 2019

(87) PCT Pub. No.: WO2019/002694
PCT Pub. Date: Jan. 3, 2019

(65) Prior Publication Data
US 2020/0136353 A1    Apr. 30, 2020

(30) Foreign Application Priority Data

Jun. 30, 2017 (FI) .................... 20175636

(51) Int. Cl.
*H01S 5/20* (2006.01)
*H01S 5/32* (2006.01)
*H01S 5/323* (2006.01)

(52) U.S. Cl.
CPC .......... *H01S 5/2031* (2013.01); *H01S 5/3213* (2013.01); *H01S 5/32391* (2013.01); *H01S 2301/166* (2013.01)

(58) Field of Classification Search
CPC .... H01S 5/2031; H01S 5/3211; H01S 5/3213; H01S 5/32391
See application file for complete search history.

(56) References Cited

U.S. PATENT DOCUMENTS

| 5,065,404 A | 11/1991 | Okajima et al. |
| 5,732,099 A | 3/1998 | Kawasumi et al. |

(Continued)

FOREIGN PATENT DOCUMENTS

| CN | 1778024 | 5/2006 |
| CN | 102099909 | 6/2011 |

(Continued)

OTHER PUBLICATIONS

Supplemental Search Report for EP 18 82 3875 (dated Feb. 2, 2021).

(Continued)

*Primary Examiner* — Tod T Van Roy
(74) *Attorney, Agent, or Firm* — Nixon & Vanderhye PC

(57) ABSTRACT

An apparatus is configured to operate in a single fundamental transverse mode and the apparatus includes a waveguide layer between an n-doped cladding layer and a p-doped cladding layer. The waveguide layer includes a first waveguide part, and an active layer located between the first waveguide part and the p-doped cladding layer, the active layer being asymmetrically within the waveguide layer closer to the p-doped cladding layer than the n-doped cladding layer. The refractive index of the n-doped cladding layer being equal to or larger than the p-doped cladding layer. A first end of the first waveguide part is adjacent to the n-doped cladding layer. A second end of the first waveguide part is adjacent to a first end of the active layer. A desired donor density is doped in the first waveguide part for (Continued)

controlling the carrier density dependent internal optical loss in the first waveguide part at high injection levels.

20 Claims, 4 Drawing Sheets

(56) References Cited

U.S. PATENT DOCUMENTS

| | | | | |
|---|---|---|---|---|
| 6,167,073 | A * | 12/2000 | Botez | H01S 5/205 372/45.01 |
| 6,522,677 | B1 * | 2/2003 | Petrescu-Prahova | H01S 5/20 372/45.01 |
| 6,606,334 | B1 * | 8/2003 | Shigihara | H01S 5/223 372/45.01 |
| 7,667,226 | B2 * | 2/2010 | Yanamoto | B82Y 20/00 257/14 |
| 8,798,109 | B2 * | 8/2014 | Gotz | H01S 5/2031 372/50.1 |
| 8,897,329 | B2 * | 11/2014 | Sizov | B82Y 20/00 372/45.01 |
| 9,478,943 | B2 | 10/2016 | Ryvkin et al. | |
| 2001/0002048 | A1 | 5/2001 | Koike et al. | |
| 2001/0009558 | A1 * | 7/2001 | Shigihara | H01S 5/22 372/45.01 |
| 2001/0053168 | A1 | 12/2001 | Mathur | |
| 2004/0208213 | A1 * | 10/2004 | Lichtenstein | H01S 5/20 372/45.012 |
| 2005/0031000 | A1 * | 2/2005 | Botez | H01S 5/22 372/46.01 |
| 2005/0213195 | A1 | 9/2005 | Belyanin et al. | |
| 2006/0126688 | A1 * | 6/2006 | Kneissl | H01S 5/34333 372/43.01 |
| 2007/0002914 | A1 * | 1/2007 | Ryu | H01S 5/2004 372/45.01 |
| 2007/0002915 | A1 | 1/2007 | Bean et al. | |
| 2011/0128982 | A1 * | 6/2011 | Huang | H01S 5/2031 372/45.01 |
| 2011/0134951 | A1 * | 6/2011 | Ryvkin | H01S 5/2031 372/45.01 |
| 2012/0069863 | A1 * | 3/2012 | Sizov | H01S 5/2018 372/45.012 |
| 2013/0287057 | A1 * | 10/2013 | Gotz | H01S 5/2018 372/50.1 |
| 2013/0308178 | A1 | 11/2013 | Matsui | |
| 2019/0372309 | A1 * | 12/2019 | Chen | H01S 5/3213 |
| 2020/0136353 | A1 * | 4/2020 | Ryvkin | B82Y 40/00 |

FOREIGN PATENT DOCUMENTS

| | | | |
|---|---|---|---|
| CN | 103119809 | 5/2013 | |
| DE | 10 2011 002 923 | 7/2012 | |
| EP | 0 638 969 | 2/1995 | |
| EP | 0 854 473 | 7/1998 | |
| EP | 1 043 819 | 10/2000 | |
| EP | 2291891 B1 * | 7/2021 | H01S 5/06216 |
| WO | 2009/144376 | 12/2009 | |

OTHER PUBLICATIONS

Avrutin et al., Asymmetric Waveguide Design of Laser Diodes for Pico- and Nanosecond Pulse Generation in the Eye Safe Spectral Range: Linear and Nonlinear Electromagnetic Effects, 2017 Progress in Electromagnetics Research Symposium—Spring (PIERS), IEEE, pp. 223 7-2238 (2017).

Garrod et al., "50% continuous-wave wallplug efficient from 1.53 μm-emitting broad-area diode lasers," Applied Physics Letters 105, pp. 071101-1-071101-5 (2014).

Garrod et al., "High Power and High Efficiency, Broad Area Diode Laser Emitting at 1.5 μm," Proc. Of SPIE vol. 9002, pp. 90021F-1-90021F-4 (2014).

E A Avrutin, et al., "Theory of direct and indirect effect of two-photon absorption on nonlinear optical losses in high power semiconductor lasers", Semiconductor Science and Technology, 2017, vol. 32, published Dec. 13, 2016, pp. 1-11.

Boris Ryvkin, et al., "Asymmetric-Waveguide Laser Diode for High-Power Optical Pulse Generation by Gain Switching", Journal of Lightwave Technology, vol. 27, No. 12, Jun. 15, 2009, pp. 2125-2131.

Finnish Search Report for FI Patent Application No. 20175636 dated Jan. 30, 2018, 2 pages.

International Search Report for PCT/FI2018/050517 dated Oct. 15, 2018, 5 pages.

International Preliminary Report on Patentability for PCT/FI2018/050517 dated Aug. 20, 2019, 19 pages.

Office Action dated Oct. 20, 2021 in corresponding Chinese Application No. 201880044043.6, 8 pages.

Boris S. Ryvkin et al., "Quantum well laser with an extremely large active layer width to optical confinement factor ratio for high-energy single picosecond pulse generation by gain switching," Semiconductor Science and Technology 26, Feb. 25, 2011, 5 pages.

Jason J. Plant et al., "1.5-μm InGaAsP—InP Slab-Coupled Optical Waveguide Lasers," IEEE Photonics Technology Letters, vol. 17, No. 4, Apr. 2005, pp. 735-737.

Notice of Allowance dated Mar. 23, 2022 in corresponding Chinese Application No. 2018800440436; 5 pages.

Joseph P. Donnelly et al., "AlGaAs—InGaAs Slab-Coupled Optical Waveguide Lasers," IEEE Journal of Quantum Electronics, vol. 39, No. 2, Feb. 2003, pp. 289-298.

Klamkin et al., "Directly modulated narrowband slab-coupled optical waveguide laser," Electronics Letters, vol. 46, No. 7, Apr. 2010, pp. 522-523.

Juodawlkis et al, "High-Power, Low-Noise 1.5-μm Slab-Coupled Optical Waveguide (SCOW) Emitters: Physics, Devices, and Applications," IEEE Journal of Selected Topics in Quantum Electronics, vol. 17, No. 6, Nov./Dec. 2011, pp. 1698-1714.

P. Epperlein, Semiconductor Laser Engineering, Reliability and Diagnostics: A Practice Approach to High Power and Single Mode Devices (2013), 98 pages. https://www.ele.uva.es/~ivasan/DO/Clases/Tema%205%20-%20LDs%20-%20Semiconductor%20Laser%20Engineering%20-%20Ch1%20-%20LD%20principles.pdf.

RP Photonics Encyclopedia—Broad Area Laser Diodes, electronically retrieved Jan. 23, 2023, 6 pages. https://www.rp-photonics.com/broad_area_laser_diodes.html.

FBH—High-Power Broad-Area Lasers, electronically retrieved Jan. 23, 2023, 4 pages. https://www.fbh-berlin.de/en/research/photonics/chips-laser-leds/high-power-broad-area-lasers.

All the Science—What is a Quantum Well?Dec. 16, 2022, 3 pages. https://www.allthescience.org/what-is-a-quantum-well.htm.

RP Photonics Encyclopedia—Quantum Wells, electronically retrieved Jan. 23, 2023, 3 pages. https://www.rp-photonics.com/quantum_wells.html.

Sacher Lasertechnik—Broad Area Diode Lasers, Multi Mode, electronically retrieved Jan. 23, 2023, 2 pages. https://www.sacher-laser.com/home/laser-diodes/high_power_laser_diodes/broad_area/multi_mode.html.

* cited by examiner

METHOD OF MANUFACTURING OPTICAL SEMICONDUCTOR APPARATUS AND THE APPARATUS

This application is the U.S. national phase of International Application No. PCT/FI2018/050517 filed Jun. 28, 2018 which designated the U.S. and claims priority to FI Application No. 20175636 filed Jun. 30, 2017, the entire contents of each of which are hereby incorporated by reference.

FIELD

The invention relates to an optical semiconductor apparatus and its manufacturing.

BACKGROUND

High-power pulsed diode lasers operating in the eye-safe region of 1400-1700 nm are becoming increasingly important, for applications ranging from EDFA pumping to laser radar technology. Additionally, various applications such as automobile safety devices, laser radars, 3-D imaging, laser tomography, time imaging spectroscopy, etc., require optical sources which generate optical pulses effectively.

However, obtaining the output power effectively within this spectral range is a more complex task than for shorter wavelengths, for example 1 μm, owing mainly to higher optical losses at high currents in InGaAsP and AlGaInAs quaternary compound materials capable of laser emission in the this range.

Thus, there is a need to increase the optical efficiency of the semiconductor devices.

BRIEF DESCRIPTION OF THE INVENTION

An object of the invention is to provide an improved optical semiconductor apparatus. According to an aspect of the invention, there is provided a method of manufacturing an optical semiconductor apparatus in claim 1.

According to another aspect of the invention, there is provided an optical semiconductor apparatus in claim 6.

The invention provides several advantages. The doping a desired donor density in the first waveguide part results in improvement in the efficiency and thus also in the output power of the optical semiconductor apparatus. The improvement in efficiency is, in turn, based on lower optical losses in the waveguide due to decrease in the inhomogeneous carrier accumulation.

LIST OF DRAWINGS

In the following, the invention will be described in greater detail with reference to the embodiments and the accompanying drawings, in which FIGS. 1 and 2 illustrate examples of a structure of an optical semiconductor apparatus;

DESCRIPTION OF EMBODIMENTS

Figure 1:
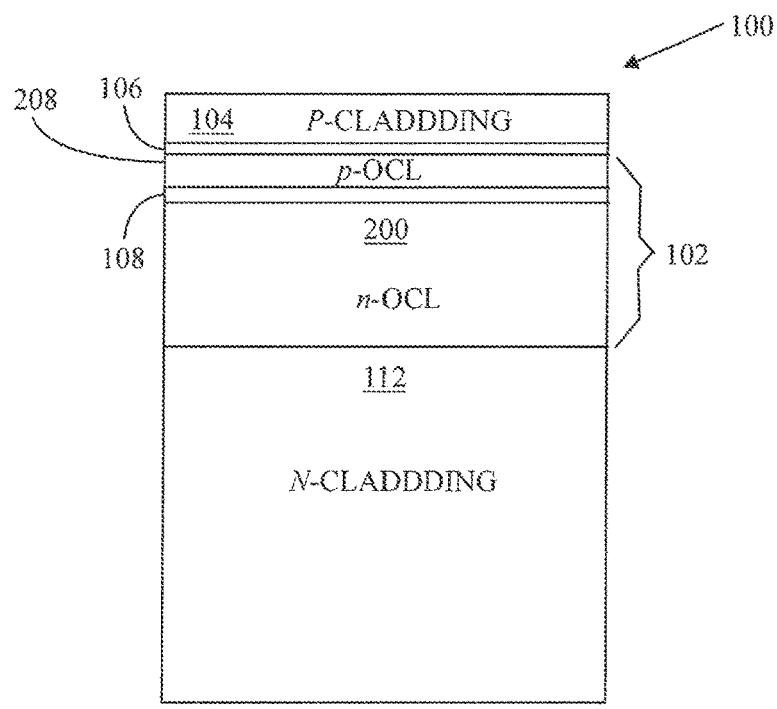

The following embodiments are only examples. Although the specification may refer to "an" embodiment in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

It should be noted that while Figures illustrate various embodiments, they are simplified diagrams that only show some structures and/or functional entities. It is apparent to a person skilled in the art that the described apparatus may also comprise other functions and structures than those described in Figures and text. It should be appreciated that some details are irrelevant to the actual invention. Therefore, they need not be discussed in more detail here.

The origin of the optical losses in the semiconductor lasers and amplifiers is to a significant degree in the accumulation of charge carriers in the optical confinement layer i.e. in the waveguide at high electric currents. The effect on this charge carrier accumulation on optical losses is strong in the InGaAsP (Indium Gallium Arsenide Phosphide) and AlGaInAs (Aluminum Gallium Indium Arsenic) quaternaries, for example, for at least two reasons. Firstly, in quaternary III-V materials in the eye safe spectral region, the free-hole IVBA (Intervalence Band Absorption) cross-section, which scales the optical losses, is rather high (2-6× $10^{-17}$ cm$^2$ as opposed to $1 \times 10^{-17}$ cm$^2$ typical for GaAs/AlGaAs materials at ~1 μm). Crucially, the ratio of the IVBA (free hole) cross section to the free electron absorption cross-section, which is greater than one in all III-V materials, is particularly high (almost two orders of magnitude) in the quaternary materials. Secondly, the low hole diffusion coefficients in the OCL (Optical Confinement Layer, i.e. waveguide layer) can lead to a high density of inhomogeneously distributed nonequilibrium carriers (both electrons and holes) in the OCL, which has its origin in the carrier transport through the OCL and in the carrier generation by two-photon absorption and leads to optical and recombination losses.

The mechanism causing the optical losses is the dominant one in broadened laser structures with a (near-)symmetric position of the active layer. Due to the diffusion of the holes being much weaker than that of the electrons, the inhomogeneous carrier accumulation at the p-side of the OCL, between the active layer and the p-cladding, is considerably stronger than that at the n-side, between the n-cladding and the active layer. Although p-doping of the p-side of the OCL reduces the build-up of non-equilibrium carriers caused by the current flow, the effect of this on internal loss is, under all conditions and in all designs studied, not as strong as the absorption by equilibrium holes introduced by the doping itself. The net effect of p-doping on the optical properties of the laser or the like is thus always an increase in the optical losses. At moderate currents, the effect of this on the wall-plug efficiency may be overcome by the decrease in the electrical resistance with doping; however at high currents, the latter effect is rather weak.

Figure 2:
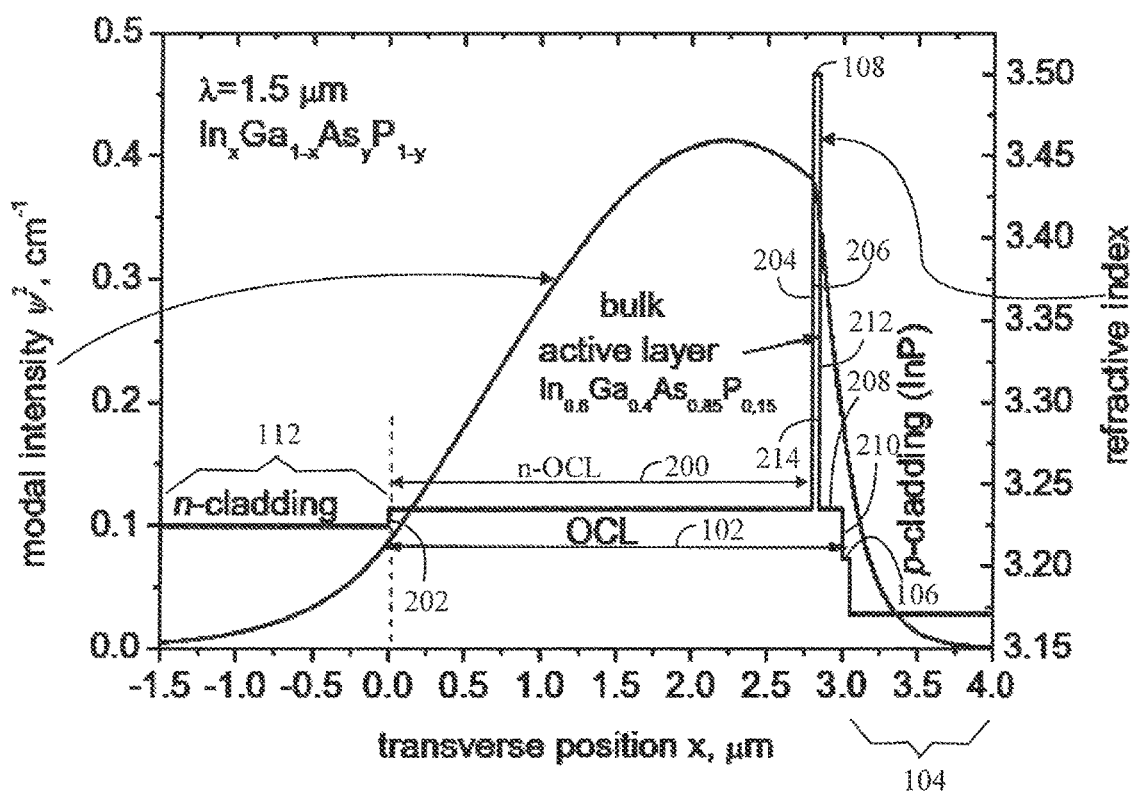

FIGS. 1 and 2 illustrate an example of the optical semiconductor apparatus 100 which counteracts the effect of the current-induced charge carrier accumulation resulting in the optical losses at a high power. FIG. 1 a side view of the apparatus 100 and FIG. 2 is a top view of the apparatus 100. The improvement in efficiency and thus also in the output power is based on a suitably donor-doped waveguide (optical confinement) layer 102, specifically its n-side 200.

The apparatus 100 may be a laser or an optical amplifier. The laser may be an eye safe laser. The apparatus 100 operates in a single fundamental transverse mode. The apparatus 100 comprises a waveguide (optical confinement) layer 102 between an n-doped cladding layer 112 and a p-doped cladding layer 104. n-doping means that donor impurities are added to a material. Correspondingly, p-doping means that acceptor impurities are added to a material.

The waveguide layer 102, in turn, includes a first waveguide (optical confinement) part 200 (n-OCL), and an active layer 108 where stimulated recombination of the electrons and holes takes place and generates optical radiation when the apparatus 100 is in operation. The active layer 108 is located between the first waveguide part 200 and the p-doped part of the OCL 208. The active layer 108 is also asymmetrically located within the waveguide layer 102 such that the active layer 108 is closer to the p-doped cladding layer 104 than the n-doped cladding layer 112.

Additionally, the refractive index of the n-doped cladding layer 112 is equal to or larger than the p-doped cladding layer 104. A first end 202 of the first waveguide part 200 is adjacent to the n-doped cladding layer 112. In more detail, the first end 202 of the first waveguide part 200 may be directly adjacent to the n-doped cladding layer 112. A second end 204 of the first waveguide part 200 is adjacent to a first end 206 of the active layer 108. Correspondingly in more detail, the second end 204 of the first waveguide part 200 may be directly adjacent to a first end 206 of the active layer 108.

A desired donor density is doped in the first waveguide part 200 for controlling an internal optical loss in the first waveguide part 200 because the internal optical loss is donor density dependent.

The internal optical loss is caused by inhomogeneous hole accumulation in the n-doped waveguide part 200 and the hole accumulation may be reduced on basis of a suitable donor density in the n-doped waveguide part 200. Doping for the suitable donor density may, in an embodiment, be strong.

The apparatus 100 shown in FIGS. 1 and 2 has an asymmetric position of the active layer 108, much closer to the p-cladding 104 than to the n-cladding 112. That ensures that the p-OCL 208 of the waveguide 102 is thin, in the extreme asymmetry case (almost non-existent). The asymmetric active layer position may be combined with the asymmetry of the refractive index steps at the interfaces of the active layer 108 with the n-cladding 112 (small step) and p-cladding 104 (large step). Such lasers or the like allow single transverse mode operation in arbitrarily broad lasers and provide high power pulsed operation (at $\lambda \sim 1$ μm) in broad-area designs.

However even lasers or the like with an asymmetric active layer 108 position and waveguide 102 (operating at $\lambda \sim 1$ μm) still exhibit saturation of optical power at high injection level (see FIG. 5) indicating the presence of some optical losses increasing with current. At least two mechanisms can contribute to this. The first is the inhomogeneous current-induced accumulation of carriers (of both signs simultaneously) in the n-OCL 200, i.e. first waveguide part 200, which, although weaker than the effect in the p-OCL 208, may become of some importance if the first waveguide part 200 (n-OCL) is very broad (a few micrometres) and the IVBA cross-section is high. The second mechanism is related to the effects of Two-Photon-Absorption (TPA), both direct and indirect, the latter being due to Free Carrier Absorption (FCA) by TPA-generated carriers in the OCL 102 (i.e. waveguide), most importantly IVBA by TPA-generated holes. The indirect effect becomes important in waveguides 102 with active layer 108 in an asymmetric location, in which the active layer 108 (the drain location for TPA-excited carriers) is far from the mode peak (where the maximum of charge carrier generation is located).

The effects of IVBA by non-equilibrium charge carriers may be weakened by n-doping of the first part of the waveguide (n-OCL) 200, which effectively removes both the charge carriers accumulated due to the transport (mainly by adding drift transport to diffusion) and those generated by the TPA (mainly by introducing additional charge carrier dissipation through recombination). As in the case of p-doping, this is to a certain degree offset, particularly at low to moderate injection levels, by some (equilibrium and, in the case of homogeneous doping, homogeneously distributed) free carriers, and hence FCA, added by the doping itself. However, inhomogeneously distributed charge carriers whose density is reduced by doping are both electrons and holes in equal quantities, whereas only electrons are introduced by n-doping. Due to the free-hole absorption cross section in InGaAsP quaternaries or the like being much stronger than the free-electron absorption cross section, the net effect, unlike the case of p-doping, is a reduction of optical loss.

Figure 6:
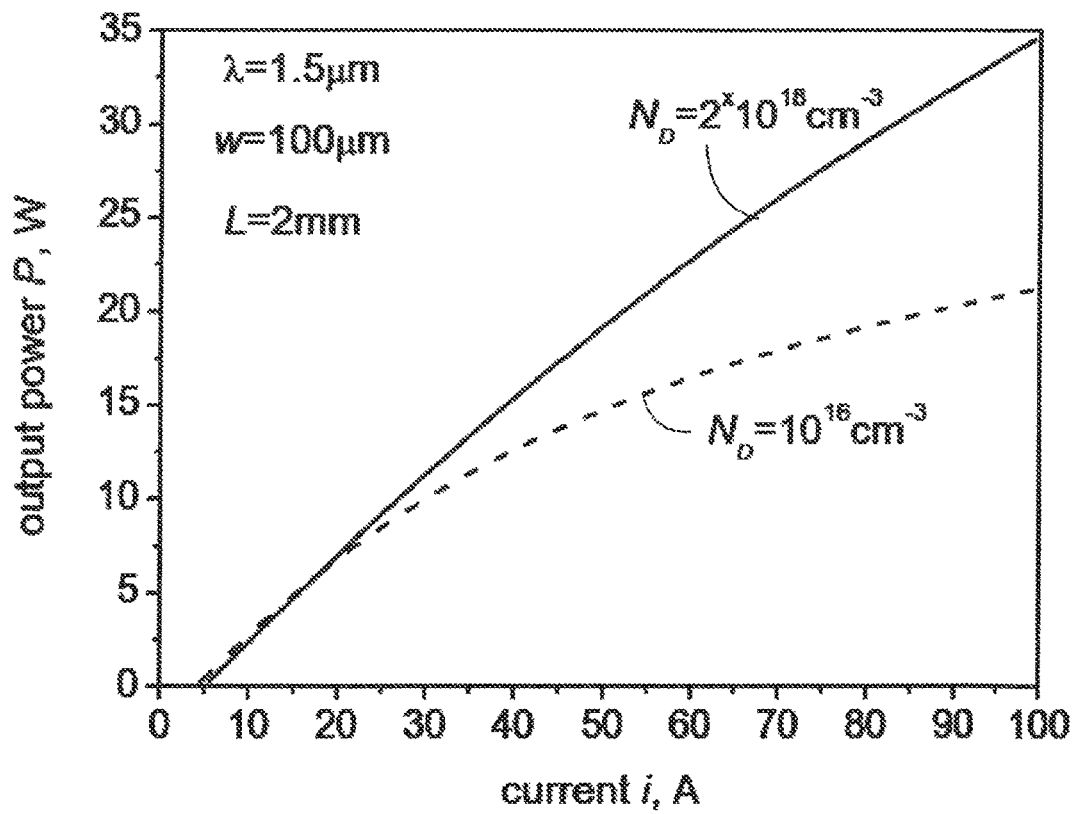
FIG. 6 illustrates an example of calculated light-current curves for low and high doping.

Thus, by doping a desired donor density in the first waveguide part 200 (n-OCL) equal to or higher than $2*10^{17}$ cm$^{-3}$ can be used to control the charge carrier density dependent internal optical loss in the first waveguide part 200 (n-OCL), particularly at high injection levels (see FIG. 6).

FIG. 2 illustrates an example of an InGaAsP structure designed to emit at $\lambda \approx 1.5$ μm. The bulk InGaAsP active layer 108 is located just about 0.15 μm (which is thus the thickness of the second waveguide part 208 (p-OCL)) from the p-cladding 104). The second waveguide part 208 (p-OCL) may be relatively highly doped (say $2 \times 10^{17}$ cm$^{-3}$ to $6 \times 10^{17}$ cm$^{-3}$). A suitable doping level may be $5 \times 10^{17}$ cm$^{-3}$, for example. A similar doping level may be at the adjacent part of the p-cladding 104 itself. This does not cause a strong optical loss due to the small thickness of the second waveguide part 208 (p-OCL) and weak penetration of the mode into the p-cladding 104. Despite the broad total width of the waveguide 102 (OCL; h=3 μm), the small refractive index step at an interface of the first waveguide part 200 (n-OCL) and n-cladding 112 ensures that the waveguide 102 supports a single transverse mode, whose profile (modal intensity) is also shown in FIG. 2. The calculated fast-axis far field width is about 17 degrees FWHM (Full Width at Half Maximum).

The carrier density profile in the waveguide 102 (n-OCL 200) can be separated into, firstly, the TPA-independent part including the spatially homogeneous background $N_b$ and the spatially inhomogeneous part $\Delta N_j(x)$ caused only by current flow, and secondly, the TPA-dependent part $\Delta N_{TPA}(x,z)$ proportional to the square of the optical power:

$$N(x,z) = N_b + \Delta N_j(x) + \Delta N_{TPA}(x) \qquad (1)$$

Consider first the carrier accumulation due to the injection current flow. The first waveguide part 200 (n-OCL) in high-power pulsed laser diodes is usually undoped or relatively weakly doped (up to the ionised donor density of $N_D < 10^{17}$ cm$^{-3}$). In such a case, under high injection level, the current in the first waveguide part 200 (n-OCL) is largely due to ambipolar diffusion. This corresponds to the carrier (electron and hole) density accumulated in the first waveguide part 200 (n-OCL) due to the current flow increasing linearly from the active layer 108 to the n-cladding interface $\Delta N_j(x) \approx (j/(2 D_e))(l_a - x)$, (see FIG. 3, the dashed curve), where j is the current density, $D_e$ is the electron diffusion coefficient, and $l_a$ is the interface between the first waveguide part 200 (n-OCL) and the active layer 108.

Figure 3:
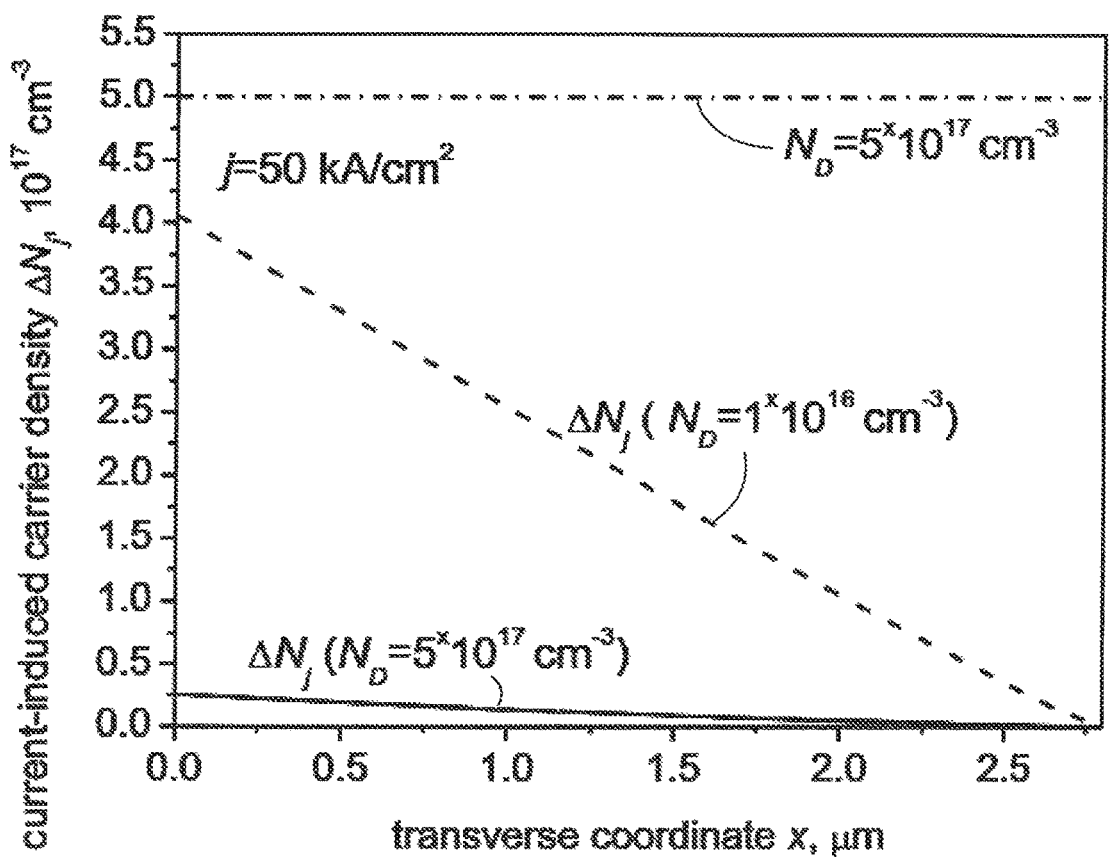
FIG. 3 illustrates an example of a traverse profile of the current induced non-equilibrium carrier density at a given current density for different doping levels.

FIG. 3 illustrates an example of a traverse profile of the current induced non-equilibrium carrier density $\Delta N_j$ at a given current density (j=50 kA/cm$^2$) for different doping levels. The doping of the broad first waveguide part 200 (n-OCL) is not fixed. The lowest optical losses in the waveguide 102 (OCL) at high injection levels may be realised in the case of the highly doped (with the ionised donor density $N_D > 10^{18}$ cm$^{-3}$) first waveguide part 200 (n-OCL). The opposite case of very low doping ($N_D$ is about $10^{16}$ cm$^{-3}$) in the whole waveguide 102 (OCL) is also presented for comparison and reference in FIG. 3.

As the doping increases, the drift component of the electric current becomes increasingly important, and at a doping level $N_D > 5 \times 10^{17}$ cm$^{-3}$, the electric current is almost entirely due to drift. The distribution $\Delta N_j(x)$ for this case can be calculated using a transcendental equation:

$$\Delta N_j(x) - N_b + \frac{N_D}{2} \ln\left(\frac{\Delta N_j(x)}{N_b}\right) = \frac{j}{2eD_e}(l_a - x) \quad (2)$$

where $0 < x < l_a$.

The calculated value of $\Delta N_j(x)$ does exceed about $5 \times 10^{16}$ cm$^2 << N_D$ (as shown in FIG. 3, the solid curve).

The spatially homogeneous background $N_b$ can be estimated as:

$$N_b \approx \frac{j}{ed_a} \tau_{cap} + N_{bT},$$

where $\tau_{cap}$ is a characteristic time of a carrier capture into the active layer 108, which can be expected to remain short, due to the relatively thick (of a thickness $d_a = 50$ nm (500 Å)) bulk active layer 108; we used $\tau_{cap} = 0.1$ ps=constant. The term $N_{bT}$ describes the thermal escape from the active layer 108 into the waveguide 102 (OCL) (the quasi Fermi levels of electrons and holes in the active layer 108 necessary for this calculation were obtained simultaneously with calculating the current-dependent effective threshold). Under a room temperature operation it $N_{bT}$ does not exceed $(1-3) \times 10^{16}$ cm$^{-3}$, though it may become dominant at elevated temperatures which are characteristic of a true continuous wave high power operation.

The contributions of free-carrier absorption by the current-induced and thermally-excited carriers to the internal loss may be calculated as:

$$\alpha_j^{(FC)} \approx (\sigma_e + \sigma_h) \int_0^{l_a} [N_b - N_{bT} + \Delta N_j(x)] \Psi^2(x) dx$$

$$\alpha_T^{(FC)}(i) \approx (\sigma_e + \sigma_h)(\Gamma_{n-OCL} + \Gamma_{p-OCL}) N_{bT} \quad (4)$$

Figure 4:
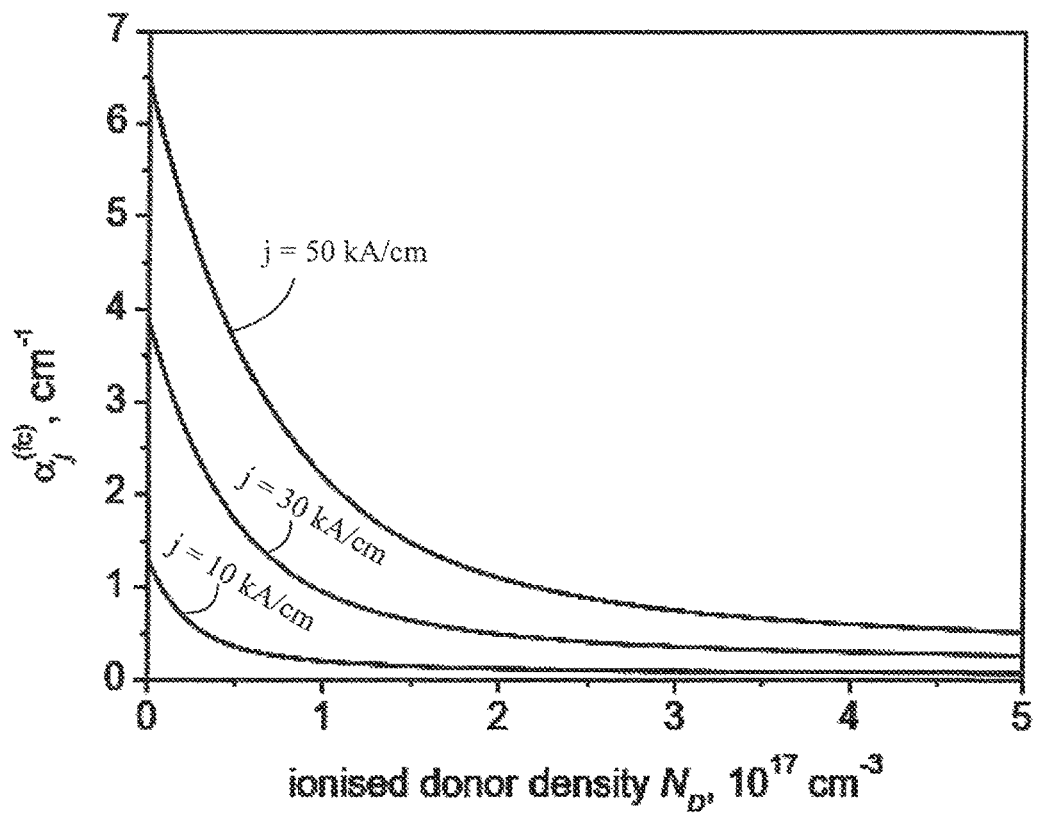
FIG. 4 illustrates an example of doping level dependence of the internal absorption due to current induced non-equilibrium carriers at different electric currents.

FIG. 4 shows an example of the dependence of $\alpha_j^{(FC)}$ on doping for several current density values. For the free-carrier absorption cross-sections, $\sigma_e$ about $0.05 \times 10^{-17}$ cm$^2$ is used, and $\sigma_h$ about $4 \times 10^{-17}$ cm$^2$ is used. $\Psi^2$ (x) is the amplitude profile of the transverse mode of the laser waveguide, normalised so that $\int_{-\infty}^{\infty} \Psi^2(x) dx = 1$. Specifically, within the waveguide 102 (OCL), $$\Psi(x) = \sqrt{\frac{2}{h_{eff}}} \cos(\kappa x - \varphi),$$

where $$\kappa = \frac{2\pi}{\lambda} \sqrt{n_{OCL}^2 - n_0^2}$$

is the transverse wave vector of the waveguide mode in the waveguide layer 102 (OCL), determined by the refractive index $n_{OCL}$ of the layer 102 (OCL) and the effective refractive index no of the fundamental (TE) mode.

The doping of the first waveguide part 200 significantly reduces the absorption even at highest current densities. The doping value $N_D$ at about a range $1 \times 10^{17}$ cm$^{-3}$ to $3 \times 10^{17}$ cm$^{-3}$ seems to sufficient to reduce the absorption significantly whereas further doping does not necessarily offer much appreciable advantage. A maximum doping value $N_D$ may thus be $3 \times 10^{17}$ cm$^{-3}$, for example. A maximum doping value $N_D$ may also be $5 \times 10^{17}$ cm$^{-3}$, for example.

As already explained above, the charge carrier accumulation takes also place due to two-photon absorption (TPA) in the waveguide 102 (OCL). Namely, the InGaAsP quaternaries or the like at A 1.5 μm may have a higher two-photon absorption coefficient ($\beta_2 \approx 6 \times 10^{-8}$ cm/W), which may make the effect of TPA-generated charge carriers detrimental. However, also this effect, like the current induced contribution, may be reduced by n-doping the first waveguide part 200 (n-OCL). For this absorption reduction to be effective, the level of doping should be such that the recombination time of nonequilibrium minority holes is comparable to, or smaller than, the characteristic time of diffusion of those holes towards the active layer 108. This corresponds to the highly doped case, where the doping level $N_D$ is much higher than $\Delta N_{TPA}$, $\Delta N_{TPA}$ being the density of nonequilibrium carriers due to TPA (equal for electrons and holes).

Figure 5:
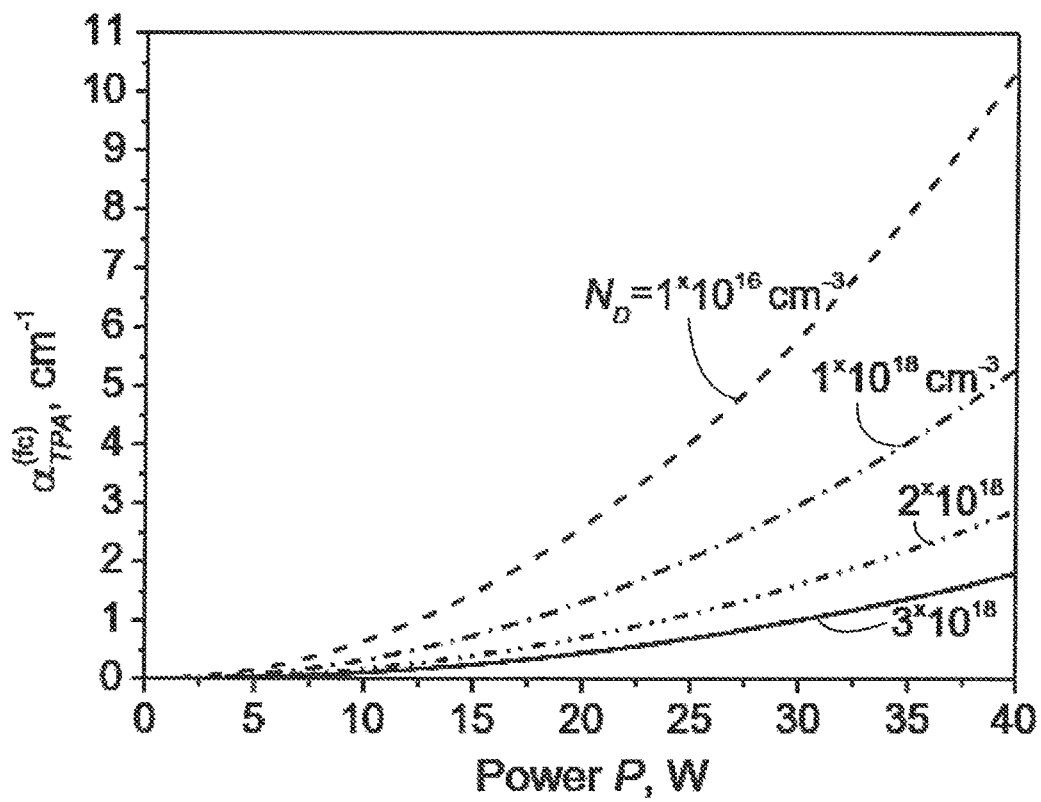
FIG. 5 illustrates an example of power dependence of the internal absorption due to TPA-induced nonequilibrium carriers at different current.

FIG. 5 illustrates an example of power dependence of the internal absorption due to TPA-induced nonequilibrium carriers at different output power levels for a few different n-doping levels of the first waveguide part 200. As in the case of the absorption by current-induced carriers $\alpha_{TPA}^{(j)}$, a pronounced reduction of absorption by doping can be seen, though for a different reason: in the case of TPA-generated carriers, it is the recombination rather than the drift transport that mainly depletes the carrier accumulation and hence reduces the absorption.

FIG. 6 illustrates calculated light-current curves for low and high doping. When the doping level of the first waveguide part 200 is low, $N_D = 10^{16}$ cm$^{-3}$, the output power of the optical semiconductor laser (certain parameters determined in FIG. 5) remains much lower than with a high doping level, $N_D = 2 \times 10^{17}$ cm$^{-3}$. In that manner, operational power of the optical semiconductor apparatus can be controlled with the donor doping level of the first waveguide part 200.

In an embodiment, the donor density $N_D$ of the first waveguide part 200 may have been set equal to or higher than $5*10^{17}$ cm$^{-3}$ in the manufacturing phase.

In an embodiment, the donor density ND of the first waveguide part 200 (n-OCL) may be set so as to cause the drift electric current to be the dominant part of the injection current. The drift electric current is caused by an electric field.

In an embodiment, the waveguide layer 102 may include a second waveguide part 208, which is p-doped. The active layer 108 may then be located between the first waveguide part 200 and the second waveguide part 208 (p-OCL). Additionally, the first end 210 of the second waveguide part 208 (p-OCL) may be adjacent to the p-doped cladding layer 104. The first end 210 of the second waveguide part 208 may be directly adjacent to the p-doped cladding layer 104. In an embodiment, a barrier layer 106 may be included to form a part of the p-doped cladding layer 104 adjacent to the second waveguide part 208 (p-OCL). Furthermore, the second end 212 of the second waveguide part 208 may be adjacent to the second end 214 of the active layer 108. In an embodiment, the second end 212 of the second waveguide part 208 (p-OCL) may be directly adjacent to the second end 214 of the active layer 108. In this embodiment, the second waveguide part 208, which is thinner than the first waveguide part 200, may be formed between the active layer 108 and the p-doped cladding layer 104. A thickness of the second waveguide part 200 (p-OCL) may correspond to a distance between the active layer 108 and the n-doped cladding layer 112.

In an embodiment, the thickness of the second waveguide part 208 (p-OCL) may be equal to or less than 0.5 μm, for example. In an embodiment, the thickness of the second waveguide part 208 may be equal to or less than 0.3 μm, for example.

In an embodiment, the apparatus 100 may be a laser, for example. The laser may be an eye safe laser which doesn't output visible optical radiation. The laser may output infrared radiation. In an embodiment, the apparatus 100 may be on optical amplifier, for example. The optical amplifier may be used in an optical cable system based on optical fibers.

In an embodiment, the apparatus 100 may comprise InGaAsP. In an embodiment, the apparatus 100 may comprise AlGaInAs. In an embodiment, the apparatus 100 may comprise InGaAsP and AlGaInAs.

Figure 7:
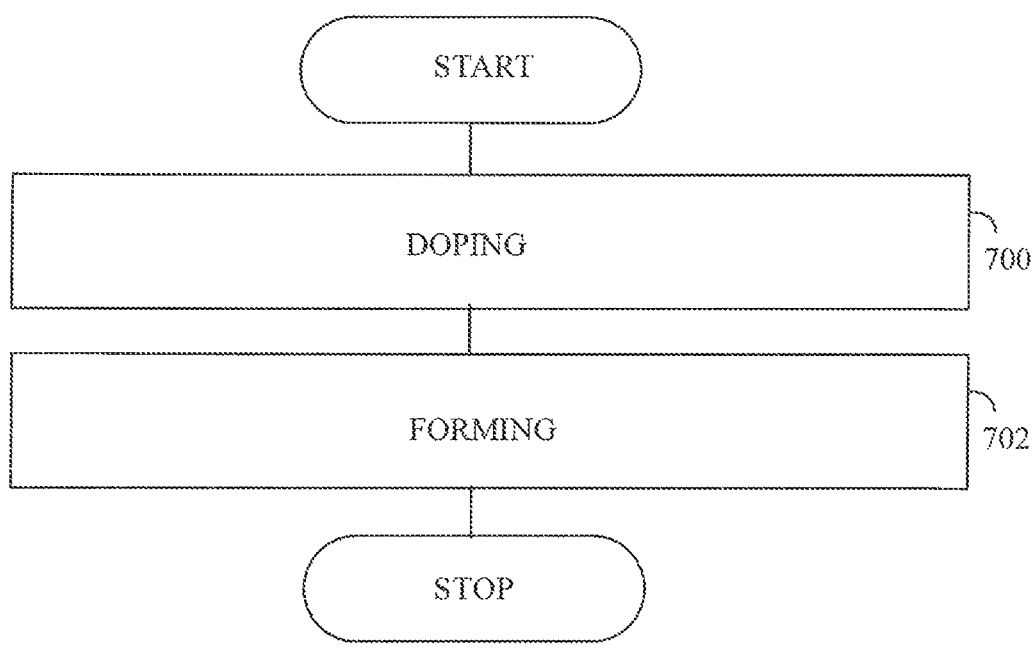
FIG. 7 illustrates a flow chart of a manufacturing method.

FIG. 7 illustrates an example of a manufacturing method of the optical semiconductor apparatus 100 which is configured to operate in a single fundamental transverse mode. The structure of the apparatus 100 has already been explained above. In step 700, a desired donor density is doped in the first waveguide part 200 for controlling a donor density dependent internal optical loss in the first waveguide part 200. In step 702 which is a possible step, the second waveguide part 208 is formed between the active layer 108 and the p-doped cladding layer 104 thinner than the first waveguide part 200 (n-OCL).

Even though the invention has been described above with reference to an example according to the accompanying drawings, it is clear that the invention is not restricted thereto but it can be modified in several ways within the scope of the appended claims.

What is claimed is:

1. A method of manufacturing an optical semiconductor apparatus, wherein the apparatus is configured to operate in a single fundamental transverse mode of wavelength range 1400 nm to 1700 nm and the method comprises forming:
   a waveguide layer of a III-V quaternary compound material between an n-doped cladding layer and a p-doped cladding layer;
   the waveguide layer includes a first waveguide part, and a bulk active layer located between the first waveguide part and the p-doped cladding layer, the bulk active layer being asymmetrically within the waveguide layer closer to the p-doped cladding layer than to the n-doped cladding layer;
   a refractive index of the n-doped cladding layer being larger than the p-doped cladding layer, and the waveguide layer being configured to have a constant refractive index throughout excluding the bulk active layer;
   a first end of the first waveguide part is adjacent to the n-doped cladding layer;
   a second end of the first waveguide part is adjacent to a first end of the bulk active layer; and
   doping a desired donor density in the first waveguide part equal to or higher than $2*10^{17}$ cm$^{-3}$ for controlling the carrier density dependent internal optical loss in the first waveguide part of the III-V quaternary compound material,
   wherein the apparatus is a broad-area laser.

2. The method of claim 1, the method further comprising setting the donor density $N_D$ of the first waveguide part equal to or higher than $5*10^{17}$ cm$^3$.

3. The method of claim 1, the method further comprising setting the donor density $N_D$ so as to cause the electric drift current to be a dominant part of the injection current in the first waveguide part.

4. The method of claim 1, wherein the waveguide layer includes a second waveguide part and the bulk active layer is located between the first waveguide part and the second waveguide part;
   a first end of the second waveguide part is adjacent to the p-doped cladding layer;
   a second end of the second waveguide part is adjacent to the second end of the bulk active layer; and
   forming the second waveguide part between the bulk active layer and the p-doped cladding layer thinner than the first waveguide part.

5. The method of claim 4, the method further comprising forming the second waveguide part the thickness of which is equal to or less than 0.3 μm.

6. The method of claim 1, wherein the bulk active layer has a thickness of 50 nm.

7. The method of claim 1, wherein the refractive index of the n-doped cladding layer and the refractive index of the waveguide layer at the first end of the first waveguide part differ by no more than 0.05.

8. The method of claim 1, wherein the refractive index of the n-doped cladding layer, and the refractive index of the waveguide layer between the first end of the first waveguide part and the bulk active layer, differ by no more than 0.025.

9. The method of claim 1, wherein the refractive indices of the n-doped cladding layer and the waveguide layer at the first end of the first waveguide part differ by a first refractive index difference between, and the refractive indices of the p-doped cladding layer and the waveguide layer at a portion thereof between the bulk active layer and the p-doped cladding layer differ by a second refractive index difference between, the first refractive index difference being smaller than the second refractive index difference.

10. The method of claim 9, wherein the refractive index of the n-doped cladding layer and the refractive index of the waveguide layer at the first end of the first waveguide part differ by no more than 0.05.

11. The method of claim 9, wherein the refractive index of the n-doped cladding layer and the refractive index of the waveguide layer at the first end of the first waveguide part differ by no more than 0.025.

12. An optical semiconductor apparatus that comprises a waveguide layer between an n-doped cladding layer and a p-doped cladding layer, wherein the apparatus is configured to operate in a single fundamental transverse mode of wavelength range 1400 nm to 1700 nm, and the waveguide layer of a III-V quaternary compound material includes a first waveguide part, and a bulk active layer located between the first waveguide part and the p-doped cladding layer, the bulk active layer being asymmetrically within the waveguide layer closer to the p-doped cladding layer than to the n-doped cladding layer;

a refractive index of the n-doped cladding layer being larger than the p-doped cladding layer, and the waveguide layer being configured to have a constant refractive index throughout excluding the bulk active layer;

a first end of the first waveguide part is adjacent to the n-doped cladding layer;

a second end of the first waveguide part is adjacent to a first end of the bulk active layer;

the first waveguide part has doping density equal to or higher than $2*10^{17}$ cm$^{-3}$ for controlling the carrier density dependent internal optical loss in the first waveguide part of the III-V quaternary compound material; and the apparatus is a broad-area laser.

13. The apparatus of claim 12, wherein the apparatus comprises at least one of the following: InGaAsP and AlGaInAs.

14. The apparatus of claim 12, wherein the refractive index of the n-doped cladding layer and the refractive index of the waveguide layer at the first end of the first waveguide part differ by no more than 0.05.

15. The apparatus of claim 12, wherein the refractive index of the n-doped cladding layer, and the refractive index of the waveguide layer between the first end of the first waveguide part and the bulk active layer, differ by no more than 0.025.

16. The apparatus of claim 12, wherein the refractive indices of the n-doped cladding layer and the waveguide layer at the first end of the first waveguide part differ by a first refractive index difference between, and the refractive indices of the p-doped cladding layer and the waveguide layer at a portion thereof between the bulk active layer and the p-doped cladding layer differ by a second refractive index difference between, the first refractive index difference being smaller than the second refractive index difference.

17. The apparatus of claim 16, wherein the refractive index of the n-doped cladding layer and the refractive index of the waveguide layer at the first end of the first waveguide part differ by no more than 0.05.

18. The apparatus of claim 16, wherein the refractive index of the n-doped cladding layer and the refractive index of the waveguide layer at the first end of the first waveguide part differ by no more than 0.025.

19. The apparatus of claim 18, wherein a calculated fast-axis far field width is about 17 degrees Full Width at Half Maximum.

20. The apparatus of claim 18, wherein the waveguide layer supports a modal intensity that is more than 3.5 times greater at a first position proximate to the bulk active layer compared to a second position proximate to the first end of the first waveguide part.

\* \* \* \* \*